United States Patent
Lee et al.

(10) Patent No.: US 9,979,007 B2
(45) Date of Patent: May 22, 2018

(54) NEGATIVE ELECTRODE MATERIAL FOR LITHIUM SECONDARY BATTERY, PRODUCTION METHOD FOR SAME, AND LITHIUM SECONDARY BATTERY COMPRISING SAME AS NEGATIVE ELECTRODE

(71) Applicant: SAMSUNG ELECTRONICS CO., LTD., Suwon-si, Gyeonggi-do (KR)

(72) Inventors: Jumyeung Lee, Daejeon (KR); Kyueun Shim, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 36 days.

(21) Appl. No.: 15/107,727

(22) PCT Filed: Aug. 8, 2014

(86) PCT No.: PCT/KR2014/007393
§ 371 (c)(1),
(2) Date: Jun. 23, 2016

(87) PCT Pub. No.: WO2015/102199
PCT Pub. Date: Jul. 9, 2015

(65) Prior Publication Data
US 2016/0329555 A1 Nov. 10, 2016

(30) Foreign Application Priority Data
Dec. 30, 2013 (KR) ........................ 10-2013-0167130

(51) Int. Cl.
| | | |
|---|---|---|
| *H01M 4/04* | (2006.01) |
| *H01M 4/133* | (2010.01) |
| *H01M 4/583* | (2010.01) |
| *H01M 4/134* | (2010.01) |
| *C23C 16/26* | (2006.01) |
| *C23C 16/02* | (2006.01) |
| *H01M 4/36* | (2006.01) |
| *H01M 4/38* | (2006.01) |
| *H01M 10/0525* | (2010.01) |
| *H01M 4/62* | (2006.01) |
| *H01M 4/48* | (2010.01) |
| *H01M 10/052* | (2010.01) |

(52) U.S. Cl.
CPC ....... *H01M 4/0428* (2013.01); *C23C 16/0272* (2013.01); *C23C 16/26* (2013.01); *H01M 4/133* (2013.01); *H01M 4/134* (2013.01); *H01M 4/366* (2013.01); *H01M 4/386* (2013.01); *H01M 4/483* (2013.01); *H01M 4/583* (2013.01); *H01M 4/621* (2013.01); *H01M 4/625* (2013.01); *H01M 10/0525* (2013.01); *H01M 10/052* (2013.01)

(58) Field of Classification Search
CPC ........... H01M 10/052; H01M 10/0525; H01M 4/0428; H01M 4/133; H01M 4/134; H01M 4/366; H01M 4/386; H01M 4/483; H01M 4/583; H01M 4/621; H01M 4/625; C23C 16/0272; C23C 16/26
See application file for complete search history.

(56) References Cited

U.S. PATENT DOCUMENTS

| | | | |
|---|---|---|---|
| 7,037,581 B2 | 5/2006 | Aramata et al. | |
| 7,862,930 B2 | 1/2011 | Kogetsu et al. | |
| 9,012,082 B2 | 4/2015 | Lee et al. | |
| 2002/0164479 A1* | 11/2002 | Matsubara | H01M 4/362 428/367 |
| 2008/0261116 A1 | 10/2008 | Burton et al. | |
| 2012/0121981 A1 | 5/2012 | Harimoto et al. | |
| 2015/0064553 A1* | 3/2015 | Kono | H01M 4/622 429/217 |

FOREIGN PATENT DOCUMENTS

| | | |
|---|---|---|
| JP | 1998302775 A | 11/1998 |
| JP | 2002298842 A | 10/2002 |
| JP | 200447404 A | 2/2004 |
| JP | 2006260944 A | 9/2006 |
| JP | 2007087796 A | 4/2007 |
| JP | 2007220411 A | 8/2007 |
| KR | 1020050090218 A | 9/2005 |
| KR | 1020100115992 A | 10/2010 |
| KR | 1020120055565 A | 5/2012 |

OTHER PUBLICATIONS

International Search Report with English Translation for International Application No. PCT/KR2014/007393 dated Dec. 19, 2014.
Written Opinion for International Application No. PCT/KR2014/007393 dated Dec. 19, 2014.

* cited by examiner

*Primary Examiner* — Carlos Barcena
(74) *Attorney, Agent, or Firm* — Cantor Colburn LLP

(57) ABSTRACT

The present invention relates to a negative electrode material for a lithium secondary battery, a method for producing same, and a lithium secondary battery comprising same as a negative electrode. The present invention provides a negative electrode material for a lithium secondary battery, the material comprising a complex in which a chemical vapor deposition (CVD) carbon coating film is formed on an amorphous carbon material comprising a silicon material that has been surface treated by a silane coupling agent.

15 Claims, 2 Drawing Sheets

[Fig. 1]
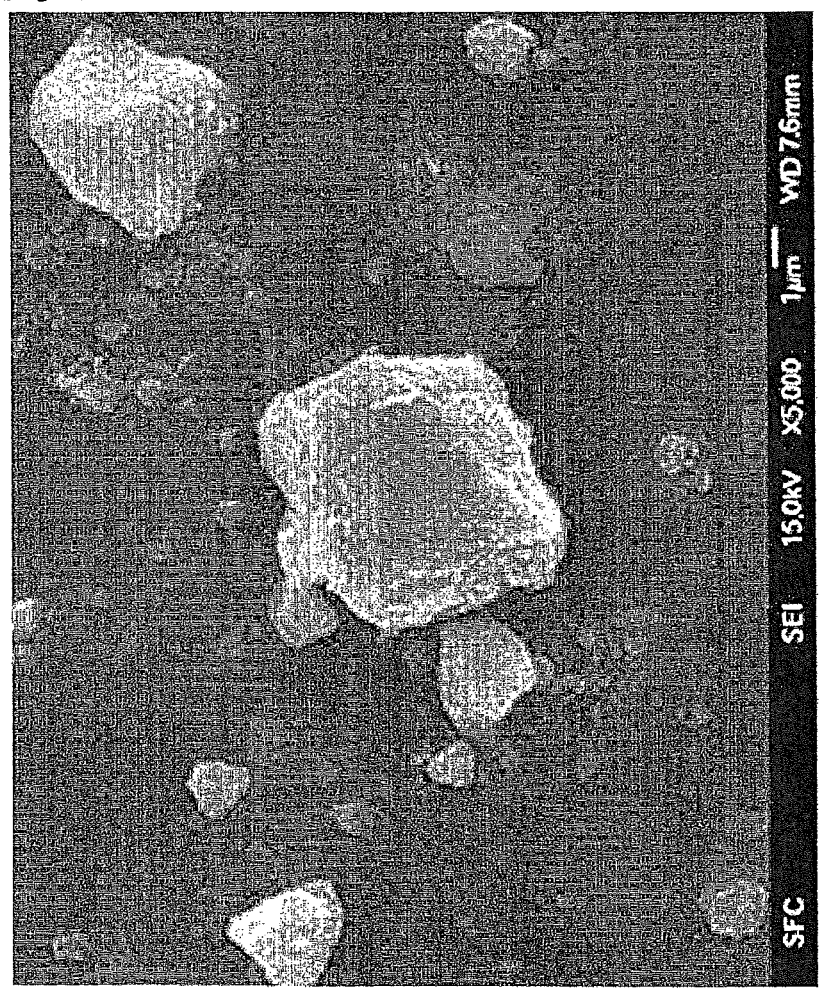

[Fig. 2]
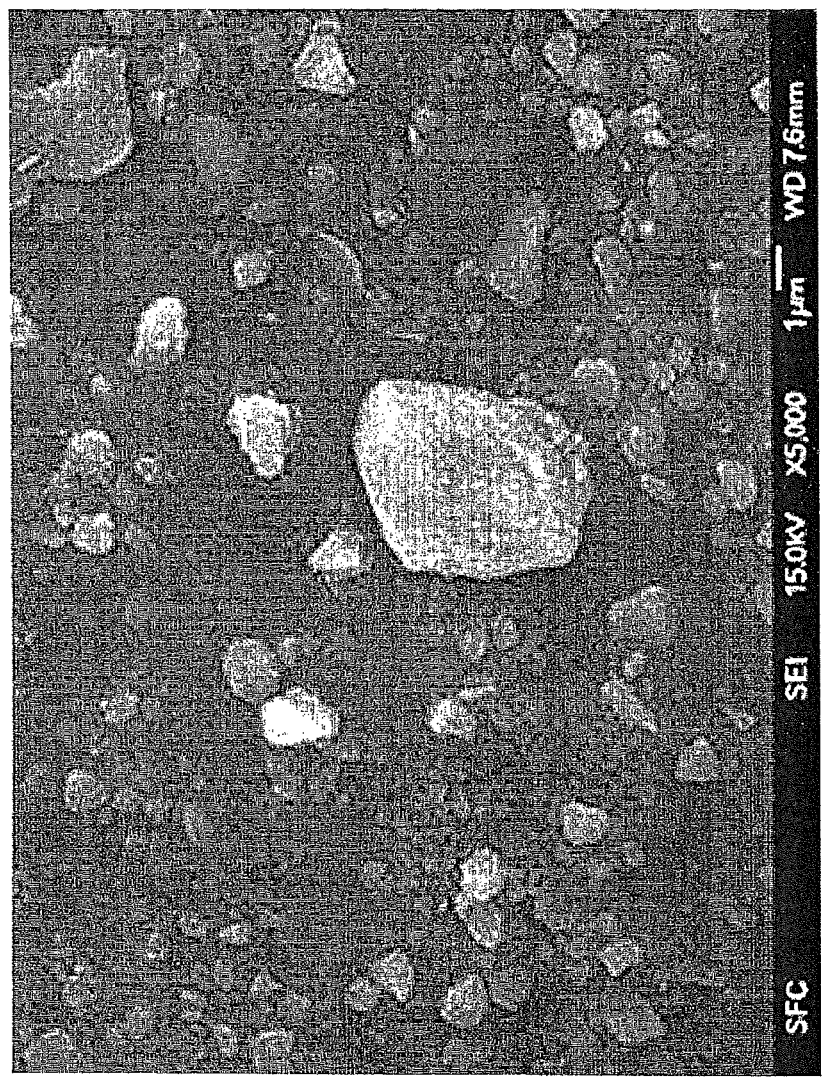

NEGATIVE ELECTRODE MATERIAL FOR LITHIUM SECONDARY BATTERY, PRODUCTION METHOD FOR SAME, AND LITHIUM SECONDARY BATTERY COMPRISING SAME AS NEGATIVE ELECTRODE

TECHNICAL FIELD

The present invention relates to a negative electrode material for a lithium secondary battery, a method for producing the negative electrode material, and a lithium secondary battery including the negative electrode material as a negative electrode, and more particularly, to a negative electrode material for a lithium secondary battery having a light weight, excellent high rate characteristics, and a high energy density by chemical vapor deposition (CVD) carbon coating a silicon material-containing amorphous carbon material with improved adhesion characteristics between an amorphous carbon material and a silicon material, a method for producing the negative electrode material, and a lithium secondary battery including the negative electrode material as a negative electrode.

BACKGROUND ART

For manufacturing electronic devices to have a small size and a light weight, demands for secondary batteries which have a light weight and a high energy density have increased. Further, secondary batteries having a fast charging/discharging speed and high safety are needed in electric vehicles or hybrid vehicles.

A secondary battery draws out chemical energy of a positive electrode active material and a negative electrode active material into the form of electrical energy by a chemical reaction via an electrolyte, and a non-aqueous lithium secondary battery is a typical secondary battery in the practical step.

Generally, a lithium-containing metal composite oxide having a spinel structure such as a lithium cobalt composite oxide is used as a positive electrode active material in the lithium secondary battery, and a carbon material, which is represented by graphite having a multilayer structure capable of intercalation of lithium metal, is used as a negative electrode active material. In recent years, a hard carbon-based material that may replace graphite due to necessary characteristics such as charging/discharging characteristic has been on the spotlight. However, a battery including a carbon material as a negative electrode active material has a capacity of about 360 mAh/g, which is close to a theoretical capacity (370 mAh/g) and cannot expect a significant capacity increase, and thus a negative electrode active material having a capacity that is higher than a capacity of carbon is essential to manufacture a high capacity battery as an energy source of a high function portable electronic device or an electric vehicle in the future. Recently, hard carbon and complexation thereof has been noticed, and Patent Documents 1 and 2 disclose attempting complexation with a material that is referred to as an alloy-based material, such as silicon. However, Patent Document 1 does not correspond with the necessary characteristics in terms of fine dispersion of silicon and adhesion with a carbon material that are important factors related to the silicon-based material, and neither does Patent Document 2 in terms of yield and initial efficiency of silicon.

In this regard, studies for practical use of an alloy-based negative electrode material including elements such as silicon or tin have been conducted. A metal element such as silicon or tin may form a metal lithium within a broad temperature range, which allows electrochemical intercalation of lithium and deintercalation of lithium ions. Also, the metal element may allow charging/discharging at a significantly large capacity, compared with that of a carbon material (where a theoretical discharge capacity of silicon is about 4200 mAh/g).

However, an alloy material including elements such as silicon or tin may cause a large volume change during intercalation and deintercalation of lithium, which may accordingly generate pulverization or fine grinding of the active material and defects in a current collector by detachment of a negative electrode layer, and thus cycle characteristics may degrade as a result.

In order to resolve the problems, improvement in various aspects such as a negative electrode material itself, a binder, and a current collector have been reviewed, and, particularly, realizing a fine structure of an active material or reducing capacity deterioration (reduction of volume change during charging/discharging) by complexation have been suggested in terms of the negative electrode material, and improvements in this regard have been achieved to a certain degree.

For example, Patent Document 3 discloses a negative electrode active material including an amorphous material that is represented by SiMx (where $0 \leq x \leq 2$ and M is at least one element selected from Ti, Ni, Cu, Co, and Fe), and Patent Document 4 discloses a negative electrode active material using a Ti—Si alloy. However, a transition metal (M) such as Ti has a high density and a heavy weight, which limit the application of the material in an electronic device that is in the trend of having a light weight.

Also, Patent Document 5 discloses a conductive silicon complex that is carbon coated at a high temperature by using a silicon oxide (SiO) as a raw material. Although cycle characteristics of a lithium secondary battery prepared by using the silicon complex as a negative electrode material improve significantly, the initial efficiency and high rate characteristics of the lithium secondary battery are not sufficient.

PRIOR ART

Patent Documents (Patent Document 1) JP4923332 B
(Patent Document 2) JP2007-220411 A
(Patent Document 3) JP2006-260944 A
(Patent Document 4) JP2007-87796 A
(Patent Document 5) JP2004-47404 A

DETAILED DESCRIPTION OF THE INVENTIVE CONCEPT

Technical Problem

The present invention provides a negative electrode material for a lithium secondary battery that has a light weight, excellent high rate characteristics, and a high energy density.

The present invention provides a method for producing the negative electrode material for a lithium secondary battery and a lithium secondary battery including the negative electrode material.

Technical Solution

According to an aspect of the present invention, there is provided a negative electrode material for a lithium secondary battery, wherein the material includes a complex, in which a chemical vapor deposition (CVD) carbon coating film is formed on an amorphous carbon material comprising a silicon material that has been surface treated by a silane coupling agent.

According to another aspect of the present invention, there is provided a method for producing the negative electrode material for a lithium secondary battery, the method including surface-treating a silicon material with a silane coupling agent; kneading and carbonizing the surface-treated silicon material and an amorphous carbon precursor to form a silicon material-containing amorphous carbon material; and fine-grinding the silicon material-containing amorphous carbon material and CVD carbon coating the silicon material-containing amorphous carbon material with hydrocarbon gas to form a complex.

According to another aspect of the present invention, there is provided a lithium secondary battery including the negative electrode material.

Effects of the Invention

According to an embodiment of the present invention, interface adhesion characteristics and a fine dispersibility may improve by surface-treating nanosilicon or a silicon compound with a silane coupling agent, and a silicon material-containing amorphous carbon material is prepared by dispersing the nanosilicon or silicon compound in amorphous carbon, wherein the silicon material-containing amorphous carbon material may have a high capacity of a silicon-based material and high charging/discharging characteristics of an amorphous carbon material.

Also, when the silicon material-containing amorphous carbon material is CVD carbon coated, volume change that occurs during charging/discharging may reduce, and electrical shorts with a current collector may be suppressed. Therefore, a negative electrode material for a lithium secondary battery having a light weight, a high energy density, and excellent cycle characteristics and a lithium secondary battery including the negative electrode material may be provided.

DESCRIPTION OF THE DRAWINGS

FIG. 1 is a scanning electron microscope (SEM) image of complex particles prepared in Example 1; and
FIG. 2 is an SEM image of complex particles prepared in Example 2.

BEST MODE

The present invention provides a negative electrode material for a lithium secondary battery, the negative electrode material including a complex, in which a chemical vapor deposition (CVD) carbon coating film is formed on an amorphous carbon material comprising silicon material that has been surface treated by a silane coupling agent.

The silicon material-containing amorphous carbon material may be nanosilicon or a nanosilicon compound that is used alone or as a mixture thereof. The nanosilicon compound may be, for example, SiO$_x$ (where, 0<x<2). A type and a preparation method for the silicon material are not particularly limited, but the silicon material may be prepared by thermal decomposition and reduction of silanes or by milling a metal silicon.

The silicon material may be used at an amount in a range of 1 wt % to 50 wt % based on a weight of the complex. When the amount of the silicon material is lower than 1 wt %, a capacity of the secondary battery may not improve. On the other hand, when the amount of the silicon material is higher than 50 wt %, capacity may deteriorate due to volume change of silicon.

Adhesiveness of an interface between the silicon material and the amorphous carbon material may improve by surface-treating the silicon material with a silane coupling agent, and thus fine dispersion may be possible. The silane coupling agent may be silane represented by Formula 1 or a partial hydrolysate thereof.

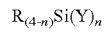
[Formula 1]

(wherein, in Formula 1, R is a monovalent organic group, Y is a monovalent hydrolysable group, and n is an integer of 1 to 3.)

Preferably, R may be a monovalent organic group having 1 to 12 carbon atoms, and the monovalent organic group may be an unsubstituted monovalent organic group or a substituted monovalent organic group that has an oxygen atom, an NH group, an NCH$_3$ group, or an NC$_6$H$_5$ group as its functional group, wherein, in Formula 1, "4-n" may be all the same or may be used as combination of organic groups of different types.

More preferably, R may be selected from the group consisting of an unsubstituted monovalent hydrocarbon group selected from a C$_1$-C$_{10}$ alkyl group, a cycloalkyl group, an alkenyl group, an aryl group, and an aralkyl group; and a substituted monovalent hydrocarbon group in which some or all hydrogen atoms of the organic group are substituted with at least one selected from a halogen group, a cyano group, an oxyalkylene group, a polyoxyalkylene group, a (meth)acryl group, a (meth)acryloxy group, an acryloyl group, a methacrylic group, a mercapto group, an amino group, an amide group, a ureido group, and an epoxy group. Examples of the unsubstituted monovalent hydrocarbon group may include an alkyl group such as CH$_3^-$, CH$_3$CH$_2^-$, or CH$_3$CH$_2$CH$_2^-$; an alkenyl group such as CH$_2$=CH$^-$, CH$_2$=CHCH$_2^-$, or CH$_2$=C(CH$_3$)$^-$; and an aryl group such as C$_6$H$_5^-$. Also, examples of the substituted monovalent hydrocarbon group may include ClCH$_2^-$, ClCH$_2$CH$_2$CH$_2^-$, CF$_3$CH$_2$CH$_2^-$, CNCH$_2$CH$_2^-$, CH$_3$—(CH$_2$CH$_2$O)$_n$—CH$_2$CH$_2$CH$_2^-$, CH$_2$(O)CHCH$_2$OCH$_2$CH$_2$CH$_2^-$ (where, CH$_2$(O)CHCH$_2$ is a glycidyl group), CH$_2$=CHCOOCH$_2^-$, HSCH$_2$CH$_2$CH$_2^-$, NH$_2$CH$_2$CH$_2$CH$_2^-$, NH$_2$CH$_2$CH$_2$NHCH$_2$CH$_2$CH$_2^-$, and NH$_2$CONHCH$_2$CH$_2$CH$_2^-$.

More preferably, R may be selected from a γ-gylcidyloxypropyl group, a β-(3,4-epoxycyclohexyl)ethyl group, a γ-aminopropyl group, a γ-cyanopropyl group, and a γ-ureidopropyl group.

In Formula 1, examples of the hydrolysable group, Y, may include an alkoxy group such as —OCH$_3$ or —OCH$_2$CH$_3$; an amino group such as —N(CH$_3$)$_2$; —Cl; an oxymino group such as —ON=C(CH$_3$)CH$_2$CH$_3$; an aminoxy group such as —ON(CH$_3$)$_2$; a carboxyl group such as —OCOCH$_3$; an alkenyloxy group such as —OC(CH$_3$)=CH$_2$; —CH$_2$COOCH$_3$; and —CH(CH$_3$)COOCH$_3$, and, for example, Y may be selected from a methoxy group, an ethoxy group, and an isopropenyloxy group. In Formula 1, Y of an integer, n, may be all the same or may be used as a combination of hydrolysable groups of different types.

Also, in Formula 1, n is an integer of 1 to 3, or, for example, 2 or 3, or, for example, 3.

Examples of the silane coupling agent may be vinyltrimethoxy silane, methylvinyldimethoxy silane, γ-aminopropyltrimethoxy silane, γ-mercaptopropyltrimethoxy silane, γ-cyanopropyltrimethoxy silane, N-β(aminoethyl)-γ-aminopropyltrimethoxy silane, γ-methacryloxypropyltrimethoxy silane, γ-glycidyloxypropyltrimethoxy silane, (3,4-epoxycyclohexyl)ethyltrimethoxy silane, and γ-ureidopropyltrimethoxy silane, but the examples are not limited thereto. The silane coupling agent may be used alone or as a mixture of at least two selected therefrom. Also, a partially condensed oligomer may be used.

An amount of the silane coupling agent may be in a range of, but is not limited to, 0.01 part to 20 parts by weight based on 100 parts by weight of the silicon material being used. When the amount of the silane coupling agent is lower than 0.01 part by weight, an interface adhesion improving effect between the silicon material and the amorphous carbon material may be insignificant. On the other hand, when the amount of silicon material is higher than 20 parts by weight, agglomeration with an amorphous carbon precursor may occur due to generation of agglomeration nuclei of the excessive silane coupling agent, which may result in processability deterioration and an increase in a manufacturing cost. Also, the amount of the silane coupling agent depends on a type of the silane coupling agent and a specific surface area of a silicon-based powder being used, and thus when a molecular weight of the silane coupling agent being used is high, the amount of silane coupling agent may increase. When a specific surface area of the silane material is large, the amount of silane coupling agent may further increase.

Hereinafter, a method for preparing a negative electrode material for a lithium secondary battery, according to an embodiment of the present invention, will be described.

The method for preparing the negative electrode material includes surface-treating a silicon material with a silane coupling agent; kneading and carbonizing the surface-treated silicon material and an amorphous carbon precursor to form a silicon material-containing amorphous carbon material; and fine-grinding the silicon material-containing amorphous carbon material and CVD carbon coating the material with hydrocarbon gas to form a complex.

As the first step, a process of the surface-treating of the silicon material with the silane coupling agent will be described.

A method for the surface-treating the silicon material with the silane coupling agent may be, for example, but is not limited to, pre-diluting the silane coupling agent in an appropriate amount of water, adding and mixing a silicon-based powder in the diluent solution, and filtering and drying the resultant. As an alternative method, a silane coupling agent aqueous solution at a high concentration may be added to an organic solvent such as methanol to prepare a solution, and a silicon-based powder may be added and mixed with the solution, and then the mixture may be filtered and dried. Here, in order to promote hydrolysis of the silane coupling agent, a catalyst may be added to the mixture. The catalyst may be at least one selected from CH$_3$COOH, NH$_3$, tetraisopropoxytitanium, dibutyl tin dilaurate, and tin dioctylate.

As the second step, a process of the kneading and carbonizing the surface-treated silicon material and the amorphous carbon precursor to form a silicon material-containing amorphous carbon material will be described.

The amorphous carbon precursor may be any material that can form a carbide, and the material may be at least one selected from the group consisting of a phenol resin such as a resol resin or a novolak resin, a furan resin, an epoxy resin, polyacrylonitrile, a polyamide resin, a polyimide resin, a polyamide-imide resin, synthetic pitch, petroleum-based pitch, coal-based pitch, and tar. For example, the amorphous carbon precursor may be a phenol resin such as a resol resin or a novolak resin, or an epoxy resin, or, preferably, a phenol resin may be used in terms of a carbonization yield. Among examples of the phenol resin, a novolak resin may be preferably used by taking into account a controlling property and reactivity.

When a phenol resin or an epoxy resin is used, a cross-linking agent that forms a cross-linking structure by reacting with a functional group thereof may be used together with the phenol resin or epoxy resin, and examples of the cross-linking agent may include polyvalent alcohols and polyvalent epoxy compounds. Examples of the polyvalent alcohol may include aliphatic polyvalent alcohols such as ethylene glycol, glycerin, or polyvinyl alcohol; or aromatic polyvalent alcohols such as pyrocatechol, resorcinol, or hydroquinone. Examples of the polyvalent epoxy compound may include aliphatic polyvalent epoxy compounds such as glycerylpolyglycidylether or trimethyrolpropanepolyglycidylether; or aromatic polyvalent epoxy compounds such as a bisphenol A-type epoxy compound. In general, the cross-linking agent may be used at an amount in a range of 1 wt % to 40 wt % based on a weight of the amorphous carbon precursor, which is a raw material.

The amorphous carbon precursor may be used at an amount in a range of 0.1 part to 100 parts by weight of the silicon material, or, may be used, preferably, at an amount in a range of 0.2 part to 50 parts by weight. The amount of the amorphous carbon precursor may be in a range of 0.5 part to 10 parts by weight by taking into account a controlling property and a lithium intercalation amount of an electrode material thus obtained.

As a first process in the second step, the silicon material surface treated with the silane coupling agent and the amorphous carbon precursor are kneaded to prepare a silicon material-containing amorphous carbon material precursor. A method for preparing the silicon material-containing amorphous carbon material precursor may be, for example, but is not limited to, dissolve-mixing.

In some embodiments, a kneading device such as a kneading roll or a single-axis or a double-axis kneader may be used. Also, when the precursor is prepared by dissolve-mixing, a mixer such as a Hanschel mixer or a disposer may be used. Also, when the precursor is prepared, an appropriate amount of solvent such as methyl alcohol may be used in the mixing.

The precursor thus obtained may be prepared by simple physical mixing of components of a plurality types or may be prepared by partially, chemically reacting by thermal energy or mechanical energy during preparation (pulverizing or kneading) of a resin composition. Also, when a bulk density is low after the kneading, the bulk density may increase by performing press-molding.

As a process after the kneading process in the second step, the silicon material-containing amorphous carbon material precursor is carbonized to prepare a silicon material-containing amorphous carbon material.

Here, a carbonizing device is not particularly limited and may be any device as long as it may perform thermal treatment in an inert atmosphere or a reduction atmosphere. The carbonizing conditions may include a temperature in a range of 500° C. to 1300° C. for 0.1 hour to 50 hours, or, for example, 0.5 hours to 10 hours. The atmosphere for the carbonizing may be an inert atmosphere of argon or nitrogen or a reduction gas atmosphere, but since a silicon powder may be nitrogenized in a nitrogen atmosphere, it is preferable to avoid using or adding nitrogen. Also, when an inert gas is circulated, hydrogen may be added, but this does not result in performance problems. The conditions such as temperature, time, and atmosphere for the carbonizing may be controlled within appropriate ranges to optimize characteristics of the carbon material.

As the last step, a process of the fine-grinding of the silicon material-containing amorphous carbon material and CVD carbon coating the material with hydrocarbon gas to form a complex will be described.

The silicon material-containing amorphous carbon material after the carbonizing process has a shape of a cake, and thus a particle diameter of the carbon material may be controlled to be appropriate through pulverization and grinding. An average particle diameter of the silicon material-containing amorphous carbon material may be in a range of 1 μm to 30 μm, or, for example, 2 μm to 20 μm. Here, when the average particle diameter of the carbon material is greater than 30 μm, an electrode may not have a smooth surface. Also, when the average particle diameter of the carbon material is less than 1 μm, an amount of the introduced binder may increase. The grinding may be performed by using a commonly used mechanical grinder, and the resultant may be shredded to remove coarse granules as the final treatment.

The finely ground silicon material-containing amorphous carbon material may be CVD carbon-coated to form a complex, and thus volume change occurring during charging/discharging and electrical shorts with a current collector may be suppressed.

The hydrogen gas used in the CVD carbon coating may be at least one selected from the group consisting of benzene, toluene, xylene, acetylene, and natural gas. When benzene, toluene, or xylene is used, they are in a liquid state at room temperature but instantly vaporize when added into a reactor, and undergo phase transition into hydrocarbon gas, which may then be used for the CVD carbon coating.

The CVD carbon coating may be performed at a temperature in a range of 500° C. to 1300° C., and the carbonization may be excited or promoted at a pressure from the atmospheric pressure to a medium vacuum state (100 to $10^{-1}$ Pa) to adsorb or deposit a carbon coating layer on a surface of the subject material.

A method for the CVD carbon coating is not limited as long as the method includes 3 processes of gas-phase raw material transfer, chemical reaction caused by providing energy (thermal, plasma, or photo), and coating film formation. For example, the method for the CVD carbon coating may be any general method such as thermal CVD, plasma CVD, or photo CVD.

When the method for the CVD carbon coating including the 3 process is used, a reaction occurs once a raw material gas is instantly introduced, and thus a homogenous coating that is not influenced by a location or a shape of the subject in a reactor may be possible. An amount of the carbon coating film may be in a range of 1 wt % to 20 wt %, or, for example, may be 2 wt % to 15 wt %, based on a weight of the complex. When the amount of the carbon coating film is lower than 1 wt %, the CVD carbon coating effect may be insignificant, and when the amount of the carbon coating is higher than 20 wt %, movement of lithium ions may be disturbed.

According to another embodiment of the present invention, provided are a negative electrode for a lithium secondary battery, the electrode using a negative electrode material including the complex, and a lithium secondary battery including the negative electrode.

The negative electrode for a lithium secondary battery may be prepared by forming a negative electrode active material layer including the complex on an electrode current collector.

The electrode current collector may be selected from the group consisting of copper foil, nickel foil, stainless steel, titanium foil, nickel foam, copper foam, a polymer substrate coated with a conductive metal, and combinations thereof.

Also, a binder and, optionally, a conducting material may be included together with the complex in an active material layer. Examples of the binder may include polytetrafluoroethylene (PTFE), polyvinylidene fluoride (PVdF), cellulose, polyethylene, polypropylene, styrene butadiene rubber (SBR), polyimide, polyacrylic acid, poly methylmethacrylate (PMMA), poly acrylonitrile (PAN), SBR, carboxymethyl cellulose (CMC), and a water-soluble polyacrylic acid (PAA), but the examples of the binder are not limited thereto.

Examples of the conducting material may include natural graphite, artificial graphite, carbon black, acetylene black, Ketjen black, carbon fibers, a metal powder or metal fibers of metal such as copper, nickel, aluminum or silver, or a conducting material such as a polyphenylene derivative, and a mixture thereof The negative electrode may be prepared by dispersing a negative electrode active material, optionally, a conducting material, and a binder into a solvent such as N-methyl-2-pyrrolidone (NMP), an organic solvent, or water to prepare a slurry composition; coating the slurry composition on an electrode current collector, and drying and pressing the electrode current collector.

The lithium secondary battery may include the negative electrode; a positive electrode including a positive electrode active material that is capable of intercalating and deintercalating lithium ions; a separator; and an electrolyte including a non-aqueous organic solvent and a lithium salt. Here, materials for the positive electrode, the separator, and the electrolyte and a shape of the battery are not limited.

Hereinafter, embodiments of the present invention will be described in detail by referring to the following examples, but the embodiments are not limited to the examples.

Example 1

As a silicon source, a metal silicon powder (available from Elkem), Silgrain (10 μm path), was ground with a planetary ball mill at a grinding force of about 50 G to prepare nanosilicon, and 3-(2-aminoethyl)aminopropyltrimethoxy silane (Z-6020, available from Dow Corning) was prepared as a silane coupling agent.

A solution was prepared by dissolving 10 parts by weight of the silane coupling agent in 100 parts by weight of pure water. 100 parts by weight of the nanosilicon was added to the solution, and the solution was mechanically stirred for 1 hour. Then, the solution was filtered and dried by using a vacuum drier at 150° C. for 12 hours to obtain a silicon powder treated with the silane coupling agent.

30 parts by weight of the silicon powder treated with the silane coupling agent and 100 parts by weight of a novolak-type phenol resin (PSM-6200, available from Gun-ei Chemicals Co., Ltd) were added to a reactor, stirred in a nitrogen atmosphere, and heated to 120° C. to obtain a homogenously dispersed mixture. Then, the mixture was moved to a Brabender-type kneader, and kneaded in a nitrogen flow at 180° C. for 3 hours to obtain a precursor of a silicon-containing amorphous carbon material. Subsequently, the precursor was moved to a quartz-glass observation hole (tube hole), heated up to 400° C. in an argon atmosphere, and the temperature was maintained at 400° C. for 1 hour. Then, the temperature was increased up to 1100° C. and maintained at 1100° C. for 1 hour to carbonize and decompose the phenol resin and the silicon powder, respectively.

A cake-shaped product obtained after cooling was crushed by using a jaw crusher, and then a silicon-containing amorphous carbon powder having an average particle diameter of 6.4 μm was obtained by using a jet mill.

The silicon-containing amorphous carbon powder was added to a reduced pressure furnace, substituted with Ar, and a CVD carbon coating raw material gas, $CH_4$(50%)/$H_2$ (50%), was in-flowed thereto. Then, thermal chemical vapor deposition (CVD) was performed thereon at a pressure of 50 Pa and a temperature of 1000° C. for 1 hour. Then, an inside pressure of the reduced pressure furnace was set as 100 Pa to adsorb and deposit the thermal decomposed carbon on a surface of the silicon-containing amorphous carbon powder.

In this regard, a complex, in which a CVD carbon coating film is formed on the silicon-containing amorphous carbon powder, was prepared, and the complex was used as a negative electrode material. A scanning electron microscope (SEM) image of the complex is shown in FIG. 1, and an amount of the carbon coating film was 7 wt % based on a weight of the complex.

Example 2

A silicon-containing amorphous carbon powder was prepared in the same manner as in Example 1, except that 3-glycidoxypropyltrimethoxysilane (KBM-403, available from Shinetsu) dissolved in 1% acetate aqueous solution was used, and an average particle diameter of the silicon-containing amorphous carbon powder was 6.1 μm.

The silicon-containing amorphous carbon powder thus obtained was CVD carbon-coated under the same conditions in Example 1 to prepare a complex, and the complex was used as a negative electrode material. An SEM image of the complex is shown in FIG. 2.

Comparative Example 1

A complex was prepared in the same manner as in Example 1, except that the nanosilicon was not treated with the silane coupling agent, and that 50 ml of isopropyl alcohol was added to a mixture of the nanosilicon and the novolak-type phenol resin since compounding during the kneading was not sufficiently performed. Also, the complex was used as a negative electrode material.

Comparative Example 2

A silicon-containing amorphous carbon powder was prepared in the same manner as in Example 1, except that the nanosilicon was not treated with the silane coupling agent but mixed with a phenol resin. The amorphous carbon powder thus obtained was used as a negative electrode material.

<Preparation of Lithium Secondary Battery>

95 parts by weight of the negative electrode materials prepared in Examples 1 and 2 and Comparative Examples 1 and 2 and 5 parts by weight of a binder mixture including PVdF and N-methylpyrrolidone at a weight ratio of 3:97 were kneaded in a THINKY mixer for 15 minutes to obtain a slurry having a solid concentration of 49%. The slurry was coated on a copper foil having a thickness of 17 μm by using a doctor blade of 42 μm and dried at 110° C. for 12 hours to prepare a negative electrode.

A counter electrode was prepared by using Li as a positive electrode material, and a non-aqueous electrolyte was a non-aqueous electrolyte solution prepared by dissolving $LiPF_6$ at a concentration of 1.3 mol/L in a solution mixture including ethylene carbonate, diethylcarbonate, and fluoroethylenecarbonate. A separator was a polyethylene fine porous film having a thickness of 17 μm, and thus a coin-type lithium secondary battery was prepared.

<Initial Efficiency and Cycle Characteristics Evaluation>

The coin-type lithium secondary battery thus prepared was maintained in a constant-temperature chamber at 25° C. for 24 hours, and a secondary battery charging/discharging testing device (available from Toyo System) was used to set a voltage range of the test cells to be 0.02 V to 1.5 V. Then, the cells were charged/discharged in a constant current/constant voltage (CC/CV) mode at a current of 0.5 C in the first cycle to obtain an initial capacity and an initial charging/discharging efficiency. After the first cycle, the cells were charged/discharged in a CC/CV mode at a current of 0.5 C, and the cycle was repeated 30 times.

A ratio of a discharge capacity with respect to a primary charge capacity was evaluated as an initial efficiency, and a capacity retention ratio during the $30^{th}$ cycle was evaluated. The results are shown in Table 1.

TABLE 1

|  | Example 1 | Example 2 | Comparative Example 1 | Comparative Example 2 |
|---|---|---|---|---|
| Initial efficiency (%) | 85 | 84 | 84 | 76 |
| Capacity (mAh/g) | 1505 | 1530 | 1603 | 1305 |
| Capacity retention ratio (%) | 75 | 78 | 45 | 38 |

Referring to Table 1, the lithium secondary batteries prepared by using a negative electrode active material, on which silane coupling treatment and CVD carbon coating were performed according to Examples 1 and 2, had increased initial efficiency and significantly improved cycle characteristics, compared to those of the lithium secondary battery of Comparative Example 1 that was not treated with a silane coupling agent nor CVD carbon-coated. Also, it was confirmed that the lithium secondary batteries prepared in Examples 1 and 2 had improved initial efficiencies, capacities, and cycle characteristics, compared to those of the lithium secondary battery prepared in Comparative Example 2 that was not treated with a silane coupling agent and not CVD carbon-coated.

The invention claimed is:

1. A negative electrode material for a lithium secondary battery, the negative electrode material comprising a complex, in which a chemical vapor deposition (CVD) carbon coating film is formed on an amorphous carbon material comprising silicon material that has been surface treated by a silane coupling agent; wherein an amount of the silicon material is in a range of 1 wt % to 50 wt % based on a weight of the complex.

2. The negative electrode material of claim 1, wherein an amount of the silane coupling agent is in a range of 0.01 part to 20 parts by weight based on 100 parts by weight of the silicon material.

3. The negative electrode material of claim 1, wherein the silicon material is at least one selected from the group consisting of nanosilicon and a nanosilicon compound.

4. The negative electrode material of claim 3, wherein the nanosilicon compound is SiOx (where, 0<x<2).

5. The negative electrode material of claim 1, wherein the CVD carbon coating film is formed by using hydrocarbon gas.

6. The negative electrode material of claim 1, wherein the CVD carbon coating film is formed by using any one method selected from thermal CVD, plasma CVD, and photo CVD.

7. The negative electrode material of claim 1, wherein an amount of the carbon coating film is in a range of 1 wt % to 20 wt % based on a weight of the complex.

8. A negative electrode for a lithium secondary battery, the negative electrode comprising the negative electrode material of claim 1.

9. A method for producing a negative electrode material for a lithium secondary battery, the method comprising:

surface-treating a silicon material with a silane coupling agent;

kneading and carbonizing the surface-treated silicon material and an amorphous carbon precursor to form a silicon material-containing amorphous carbon material; and grinding the silicon material-containing amorphous carbon material and chemical vapor deposition (CVD) carbon coating the material with hydrocarbon gas to form a complex.

10. The method of claim 9, wherein the carbonizing is performed in an inert or reduction atmosphere at a temperature in a range of 500° C. to 1300° C.

11. The method of claim 9, wherein the hydrocarbon gas used in the CVD carbon coating is at least one selected from the group consisting of benzene, toluene, xylene, acetylene, and natural gas.

12. The method of claim 9, wherein a temperature of the CVD carbon coating is in a range of 500° C. to 1300° C.

13. The method of claim 9, wherein the CVD carbon coating is performed by any one method selected from thermal CVD, plasma CVD, and photo CVD.

14. The method of claim 9, wherein an amount of the carbon coating film is in a range of 1 wt % to 20 wt % based on a weight of silicon in the complex.

15. The method of claim 9, wherein the amorphous carbon precursor is at least one selected from the group consisting of a phenol resin, a furan resin, an epoxy resin, polyacrylonitrile, a polyamide resin, a polyimide resin, synthetic pitch, petroleum-based pitch, coal-based pitch, and tar.

* * * * *